: US010204953B2

United States Patent
Lin et al.

(10) Patent No.: US 10,204,953 B2
(45) Date of Patent: Feb. 12, 2019

(54) TIME-OF-FLIGHT IMAGE SENSOR AND LIGHT SOURCE DRIVER HAVING SIMULATED DISTANCE CAPABILITY

(71) Applicant: Google LLC, Mountain View, CA (US)

(72) Inventors: Cheng-Yi Andrew Lin, Mountain View, CA (US); Clemenz Portmann, Los Altos Hills, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/782,174

(22) Filed: Oct. 12, 2017

(65) Prior Publication Data

US 2018/0033818 A1  Feb. 1, 2018

Related U.S. Application Data

(62) Division of application No. 14/579,910, filed on Dec. 22, 2014, now Pat. No. 9,812,486.

(51) Int. Cl.
| | | |
|---|---|---|
| *H04N 13/02* | (2006.01) | |
| *H01L 27/146* | (2006.01) | |
| *G01S 7/491* | (2006.01) | |
| *G01S 17/36* | (2006.01) | |
| *G01S 17/89* | (2006.01) | |
| *G01S 7/497* | (2006.01) | |
| *H04N 13/254* | (2018.01) | |
| *H04N 13/271* | (2018.01) | |
| *H04N 13/286* | (2018.01) | |

(52) U.S. Cl.
CPC ........ *H01L 27/14634* (2013.01); *G01S 7/497* (2013.01); *G01S 7/4915* (2013.01); *G01S 7/4918* (2013.01); *G01S 17/36* (2013.01); *G01S 17/89* (2013.01); *H01L 27/14618* (2013.01); *H04N 13/254* (2018.05); *H04N 13/271* (2018.05); *H04N 13/286* (2018.05)

(58) Field of Classification Search
CPC ......... H01L 27/14634; H01L 27/14618; G01S 17/36; G01S 7/497; G01S 7/4918; G01S 17/89; G01S 7/4915; H04N 13/254; H04N 13/286; H04N 13/271
USPC .......................................................... 348/46
See application file for complete search history.

(56) References Cited

U.S. PATENT DOCUMENTS

| | | | |
|---|---|---|---|
| 7,450,220 | B2 | 11/2008 | O'Connor et al. |
| 7,636,150 | B1 | 12/2009 | Mccauley et al. |
| 7,936,038 | B2 | 5/2011 | Jeong et al. |
| 7,990,636 | B2 | 8/2011 | Park et al. |

(Continued)

FOREIGN PATENT DOCUMENTS

| | | |
|---|---|---|
| CN | 101266755 A | 9/2008 |
| CN | 101977285 A | 2/2011 |

(Continued)

OTHER PUBLICATIONS

PCT/US2015/061412—International Search Report and Written Opinion, dated Feb. 29, 2016, 11 pages.

(Continued)

*Primary Examiner* — Jared Walker
(74) *Attorney, Agent, or Firm* — Fish & Richardson P.C.

(57) ABSTRACT

An apparatus is described that includes an image sensor and a light source driver circuit having configuration register space to receive information pertaining to a command to simulate a distance between a light source and an object that is different than an actual distance between the light source and the object.

9 Claims, 13 Drawing Sheets

(56) References Cited

U.S. PATENT DOCUMENTS

| | | |
|---|---|---|
| 8,027,107 B2 | 9/2011 | Hwang et al. |
| 8,116,018 B2 | 2/2012 | Park et al. |
| 8,159,762 B2 | 4/2012 | Lim et al. |
| 8,218,016 B2 | 7/2012 | Park et al. |
| 8,638,424 B2 | 1/2014 | Snow et al. |
| 2006/0221250 A1 | 10/2006 | Rossbach et al. |
| 2008/0180650 A1 | 7/2008 | Lanesch |
| 2011/0123183 A1 | 5/2011 | Adelsberger |
| 2011/0194007 A1 | 8/2011 | Kim et al. |
| 2012/0013887 A1 | 1/2012 | Xu et al. |
| 2013/0026859 A1 | 1/2013 | Bae et al. |
| 2013/0076909 A1 | 3/2013 | Marti et al. |
| 2013/0134470 A1 | 5/2013 | Shin et al. |
| 2014/0037135 A1 | 2/2014 | Kutliroff et al. |
| 2014/0078381 A1 | 3/2014 | Ovsiannikov et al. |
| 2015/0069218 A1 | 3/2015 | Cho |
| 2015/0097719 A1 | 4/2015 | Balachandreswaran et al. |

FOREIGN PATENT DOCUMENTS

| | | |
|---|---|---|
| JP | 2011-179997 | 9/2011 |
| WO | WO 2009/026642 | 3/2009 |

OTHER PUBLICATIONS

International Preliminary Report on Patentability, issued in International Application No. PCT/US2015/061412, dated Jun. 27, 2017, 8 pages.

'gamasutra.com' [online] "The Science Behind Kinects or Kinect 1.0 versus 2.0," Daniel Lau, Nov. 27 2013, [retrieved on Feb. 28, 2018] Retrieved from Internet: URL<https://www.gamasutra.com/blogs/DanielLau/20131127/205820/The_Science_Behind_Kinects_or_Kinect_10_versus_20.php> 7 pages.

'newatlas.com' [online] Hands-on with the Creative Senz3D, Adam Williams, Sep. 6, 2013, [retrieved on Mar. 13, 2018] Retrieved from Internet: URLhttps://newatlas.com/hands-on-with-the-creative-senz3d/28975/> 27 pages.

'www.adept.net.au' [online] "SR4500 Data Sheet," Mesa Imaging, Available on or before Apr. 4, 2015, [retrieved on Mar. 13, 2018] Retrieved from Internet: URL<http://www.adept.net.au/cameras/Mesa/pdf/SR4500.pdf> 4 pages.

'www.adeptnetau' [online] "Swiss Ranger SR4000," Available on or before Mar. 25, 2012 [retrieved on Mar. 14, 2018] Retrieved from Internet: URL<http://www.adept.net.au/cameras/Mesa/SR4000.shtml> 4 pages.

'www.blogs.micrsoft.com' [online] "Collaboration, expertise produce enhanced sensing in Xbox One," Jeffery Meisner, Oct. 2, 2013, [retrieved on Mar. 15, 2018] Retrieved from Internet: URL<https://blogs.microsoft.com/blog/2013/10/02/collaboration-expertise-produce-enhanced-sensing-in-xbox-one/> 11 pages.

'www.bloomberg.com' [online] "Sony's Big Bet on 3D Sensors that can See the World," Yuji Nakamura, Oct. 25, 2017, [retrieved on Feb. 27, 2018] Retrieved from Internet: URL<https://www.bloomberg.com/news/articles/2017-10-24/sony-s-big-bet-on-sensors-that-can-see-the-world> 6 pages.

'www.electronicdesign.com' [online] "How Microsogt's PrimseSense-based Kinect Really Works," William Wong, Mar. 16, 2011, [retrieved on Feb. 28, 2018] Retrieved from Internet: URL<http://www.electronicdesign.com/embedded/how-microsoft-s-primesense-based-kinect-really-works> 15 pages.

'www.engadget.com' [online] "Intel announces Creative Senz3D Peripheral Camera at Computex 2013," Myriam Joire, Jun. 4, 2013, [retrieved on Mar. 13, 2018] Retrieved from Internet URL<https://www.engadget.com/2013/06/04/intel-announces-creative-depth-vision-camera-at-computex-2013/> 9 pages.

'www.roborealm.com' [online] "Creative Senz3D," Available on or before Feb. 7, 2015, [retrieved on Mar. 12, 2018] Retrieved from Internet: URL<http://www.roborealm.com/help/Creative_Senz3D.php> 6 pages.

'www.sony.net' [online[ "Sony Develops Back-Illuminated Time-of-Flight Image Sensor with the Industry's Smallest Pixel Pitch," Jun. 5, 2017, [retrieved on Feb. 21, 2018] Retrieved from Internet: URL< https://www.sony.net/SonyInfo/News/Press/201706/17-059E/index.html> 4 pages.

'www.sony.net' [online] "Sony Releases a Back-Illuminated Time-of-Flight Image Sensor," Dec. 19, 2017, [retrieved on Feb. 21, 2018] Retrieved from Internet: URL<https://www.sony.net/SonyInfo/News/Press/201712/17-114E/index.html> 4 pages.

'www.sony-depthsensing.com' [online] "SoftKinetic DS525 Datasheet Short Range Module," Available on or before Dec. 30, 2013, [retrieved on Mar. 19, 2018] Retrieved from Internet: URL< https://www.sony-depthsensing.com/Portals/0/Documents/PDF/WEB_20131230_SK_DS525_Datasheet_V2.1.pdf> 2 pages.

'www.ti.com' [online] "OPT8241 3D Time-of-Flight (ToF) Sensor Evaluation Module," Available on or before Feb. 2, 2017, [retrieved on Mar. 14, 2018] Retrieved from Internet: URL<http://www.ti.com/tool/OPT8241-CDK-EVM#technicaldocuments> 3 pages.

Horaud et al. "An Overview of Depth Cameras and Range Scanners Based on Time-of-Flight Technologies," Machine Vision and Applications Journal, 27(7), Oct. 1, 2016, 18 pages.

Laukkanen. "Performance Evaluation of Time-of-Flight Depth Cameras," Theses submitted for Examination for the degree of Master of Science in Technology, Alto University School of Electrical Engineering, Nov. 23, 2015, 61 pages.

Li. "Time-of-Flight Camera—An Introduction," Texas Instruments Technical White Paper, SLOA190B, Jan. 2014, revised May 2014, 10 pages.

PR Newswire "SoftKinetic Provides 3D Imaging Solution for Intel All-in-One Computer Reference Design," Sep. 12, 2013, 2 pages.

Sarbolandi et al. "Kinect Range Sensing: Structured-Light versus Time-of-Flight Kinect," arXiv 1505.05459v1, May 20, 2015, 58 pages.

Extended European Search Report issued in European Application No. 15873926.8, dated Jul. 6, 2018, 8 pages.

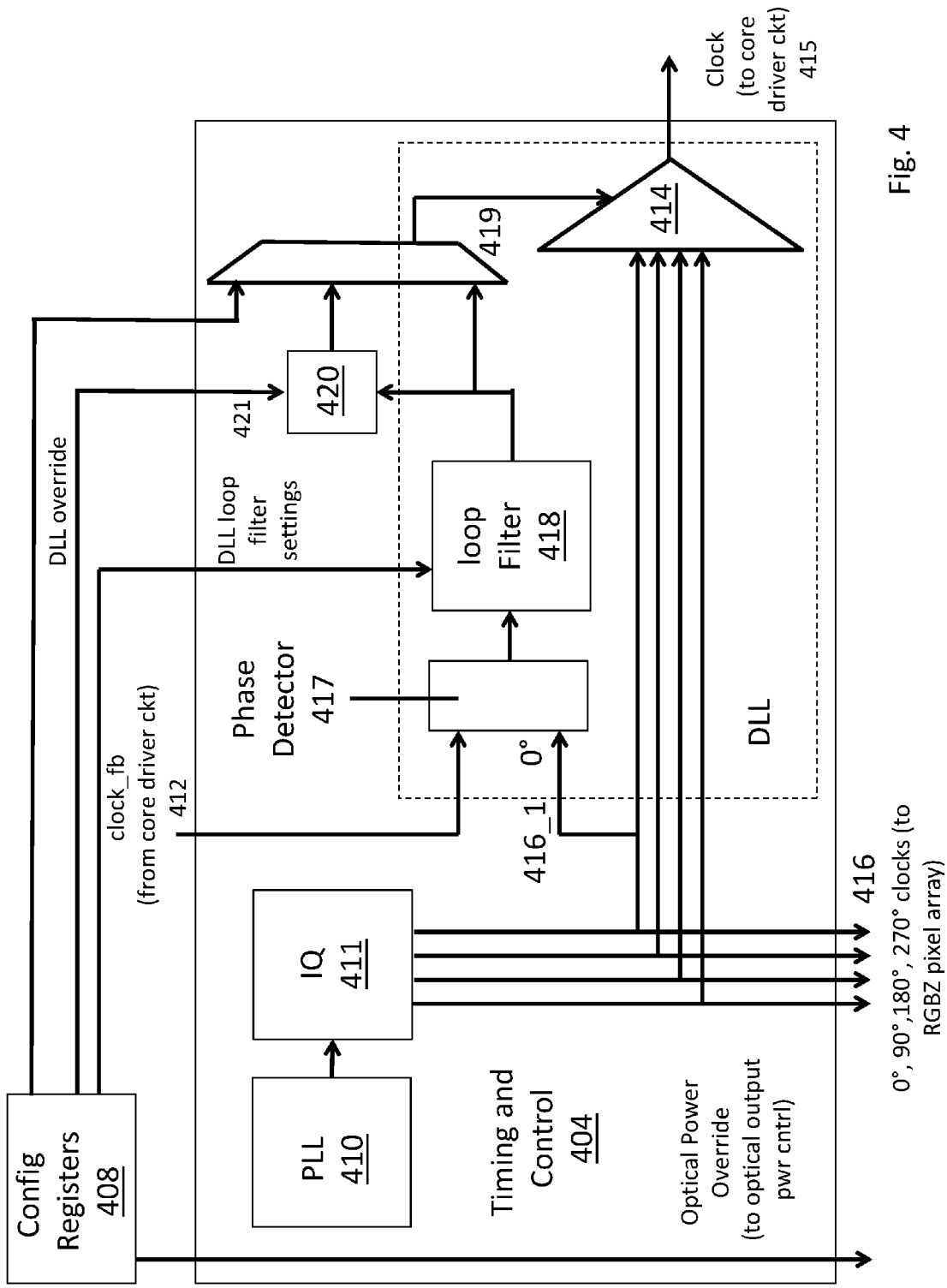

TIME-OF-FLIGHT IMAGE SENSOR AND LIGHT SOURCE DRIVER HAVING SIMULATED DISTANCE CAPABILITY

CROSS REFERENCE TO RELATED APPLICATION

This application is a divisional of U.S. application Ser. No. 14/579,910, filed Dec. 22, 2014, the contents of which are incorporated by reference herein.

FIELD OF THE INVENTION

The field of invention pertains generally to camera technology and, more specifically, to a time-of-flight image sensor and light source driver having simulated distance capability.

BACKGROUND

Many existing computing systems include one or more traditional image capturing cameras as an integrated peripheral device. A current trend is to enhance computing system imaging capability by integrating depth capturing into its imaging components. Depth capturing may be used, for example, to perform various intelligent object recognition functions such as facial recognition (e.g., for secure system un-lock) or hand gesture recognition (e.g., for touchless user interface functions).

One depth information capturing approach, referred to as "time-of-flight" imaging, emits light from a system onto an object and measures, for each of multiple pixels of an image sensor, the time between the emission of the light and the reception of its reflected image upon the sensor. The image produced by the time of flight pixels corresponds to a three-dimensional profile of the object as characterized by a unique depth measurement (z) at each of the different (x,y) pixel locations.

As many computing systems with imaging capability are mobile in nature (e.g., laptop computers, tablet computers, smartphones, etc.), the integration of a light source ("illuminator") into the system to achieve time-of-flight operation presents a number of design challenges such as cost challenges, packaging challenges and/or power consumption challenges.

SUMMARY

An apparatus is described that includes an image sensor and a light source driver circuit integrated in a same semiconductor chip package having configuration register space to receive information pertaining to a command to simulate a distance between a light source and an object that is different than an actual distance between the light source and the object.

An apparatus is described that includes means for receiving into configuration register space configuration information to simulate a distance between a light source and an object that is different than an actual distance between the light source and the object. The apparatus also includes means for generating with a light source driver a light source drive signal. The apparatus also includes means for sensing with depth capture pixels light that was generated with the light source drive signal and reflected from an object, wherein, relative phases of the light source drive signal and a clock that is directed to the depth capture pixels are adjusted to realize the simulated distance and wherein an amplitude of signals sensed with said depth capture pixels are adjusted to realize the simulated distance.

FIGURES

The following description and accompanying drawings are used to illustrate embodiments of the invention. In the drawings:

FIG. 4 shows a diagram of a timing and control circuit;

DETAILED DESCRIPTION

Figure 1A:
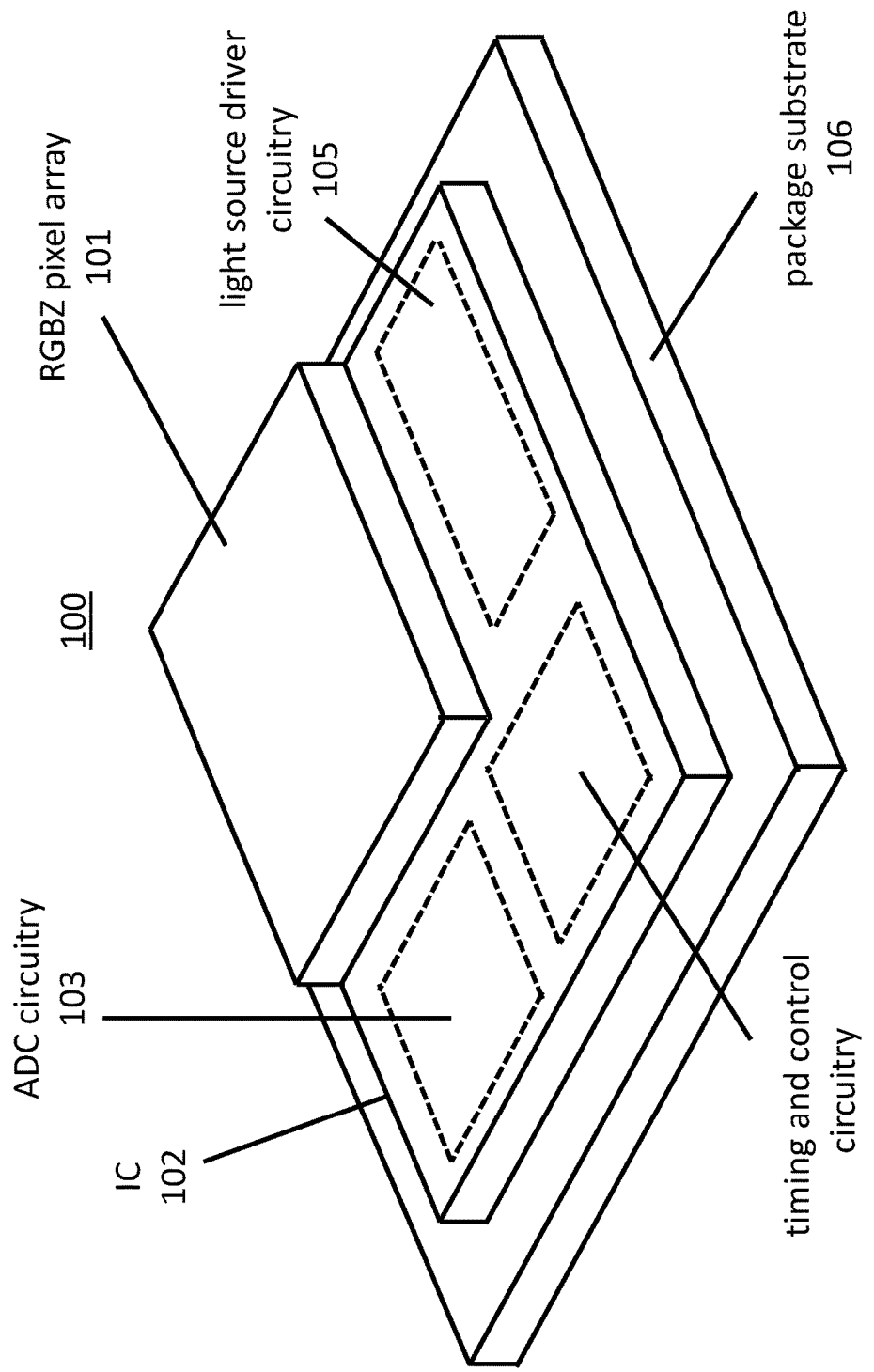
FIG. 1a shows a depiction of an embodiment of an integrated image sensor and light source driver.
Figure 1B:
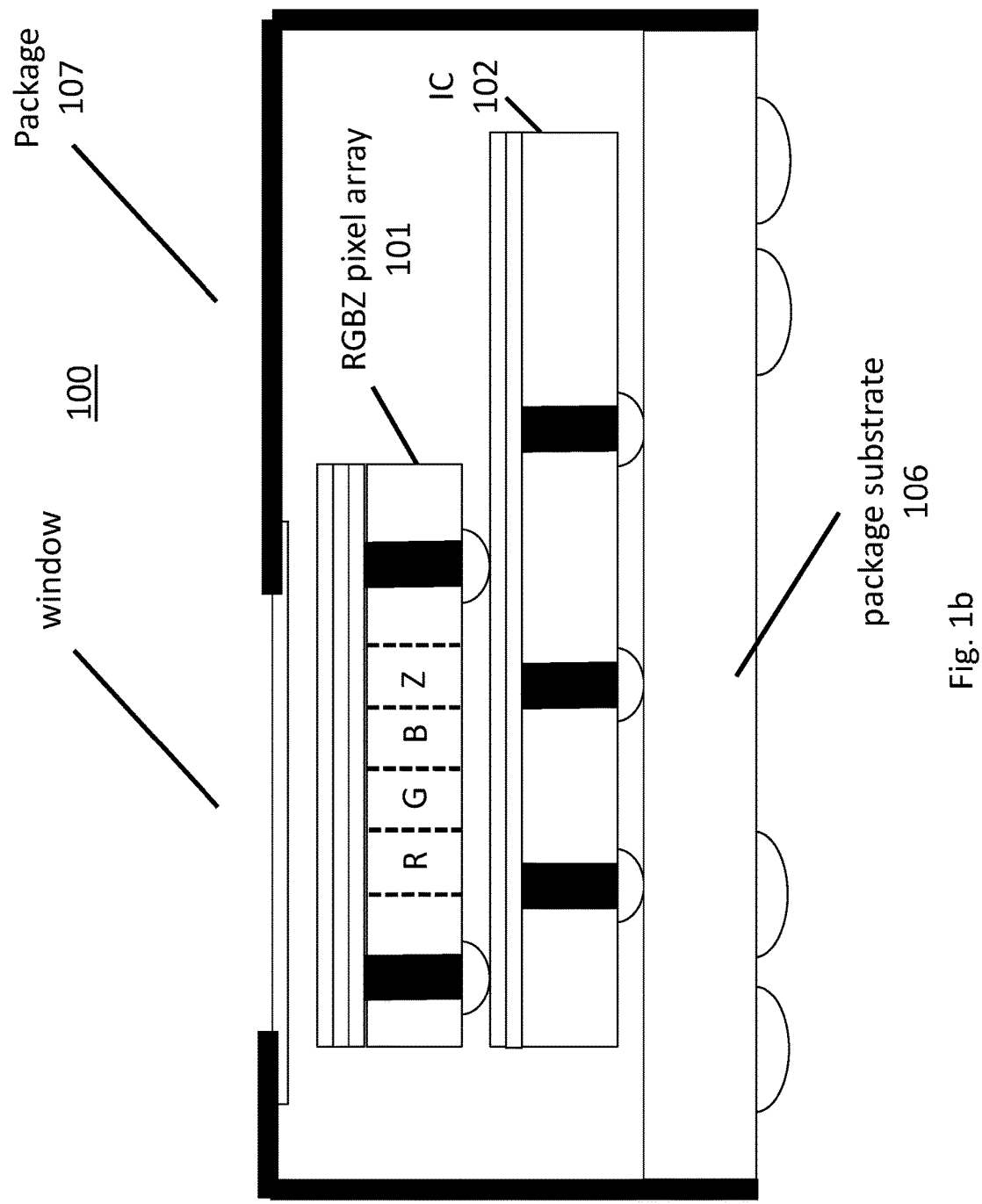
FIG. 1b shows another depiction of an embodiment of an integrated image sensor and light source driver.

FIGS. 1a and 1b show different perspectives of an integrated image sensor and light source driver 100 that addresses some of the challenges referred to in the Background. As observed in FIGS. 1a and 1b, the integrated image sensor and light source driver 100 includes an RGBZ pixel array chip 101 that is stacked on an underlying integrated circuit 102 having analog-to-digital (ADC) circuitry 103, timing and control circuitry 104 and light source driver circuitry 105. The underlying integrated circuit 102 is mounted on a package substrate 106 such that the entirely of the pixel array 101 and the underlying integrated circuit 102 are contained within a same package 107.

The RGBZ pixel array chip 101 includes different kinds of pixels, some of which are sensitive to visible light (red (R), green(G) and blue(B)) and others of which are sensitive to IR light. The RGB pixels are used to support traditional "2D" visible image capture (traditional picture/video taking) functions. The IR sensitive pixels are used to support 3D depth profile imaging using time-of-flight techniques.

A camera system having both traditional image capture and time-of-flight depth capture functions typically includes: 1) an illuminator (e.g., at least one laser, laser array, LED or LED array to generate the IR light for the time-of-flight system); 2) an RGBZ pixel array; 3) driver circuitry for the illuminator; and, 4) analog to digital conversion circuitry and timing and control circuitry that, together with the RGBZ pixel array, form a complete image sensor. Here, items 1) and 2) above can be viewed as the electro-optical components of the camera system and items 3) and 4) can be viewed as the supporting electronics for the electro-optical components. Notably, the integrated image sensor and light source driver 100 of FIGS. 1a and 1b integrate most if not all of items 2), 3) and 4) above in a single package 107 which, in turn, should provide for a cheaper and/or smaller form factor solution for these items as compared to prior art approaches.

For ease of drawing the ADC circuitry 103, timing and control circuitry 104 and light source driver circuitry 105 are drawn not necessarily to scale and not showing any "underlap" beneath the pixel array 101. It is conceivable that some solutions may opt to place some portion or the entirety of any of the ADC circuitry 103, the timing and control circuitry 104 and the light source driver 105 beneath the pixel array 101.

FIG. 1b shows an embodiment of a cross section of the pixel array 101 stacked on the underlying semiconductor die 102. As observed in FIG. 1b, electrically conductive balls/bumps formed on the top surface of the underlying integrated circuit 102 are aligned to make contact with conductive balls/bumps formed on the lower surface of the pixel array 101.

The balls/bumps on the lower surface of the pixel array 101 are connected to respective conductive vias within the pixel array substrate that electrically couple to respective traces formed within the metallization planes of the pixel array 101. As is known in the art, the metallization planes of the pixel array 101 provide biasing and/or signaling to any transistors embedded in the upper surface of the pixel array substrate as well as provide the output analog sense signals generated by the pixel array's pixels. The metallization planes may be part of a larger multilayer structure above the pixel array substrate that also includes filters (e.g., RGB filters for RGB pixels and IR filters for Z pixels) and micro-lenses.

The underlying IC 102 also includes through-substrate conductive vias that electrically connect its metallization layers to its underlying contact balls/bumps. Note that, as appropriate for any particular packaging technology, any ball/bump of a pair of contacting balls/bumps shown in FIG. 1b may be replaced with a pad/land instead of a ball/bump. Balls/bumps/pads may be disposed as an array, around the periphery or other arrangement on its corresponding die's surface. In an alternative approach, instead of a ball/bumps being formed on the lower side of the IC, the IC may include wire bond pads around its periphery and the IC may be electrically coupled to the package substrate by wire bonding from these pads to the surface of the underlying substrate.

The package substrate 107 may be made from any typical planar board technology (e.g., having alternatively layers of conductive and insulating planes, where the insulating planes are composed of any of, e.g., FR4, ceramic, etc.). As observed in FIG. 1b, the package substrate 107 also has conductive balls/bumps for electrical contact to the camera system into which the sensor and driver is integrated.

Figure 2:
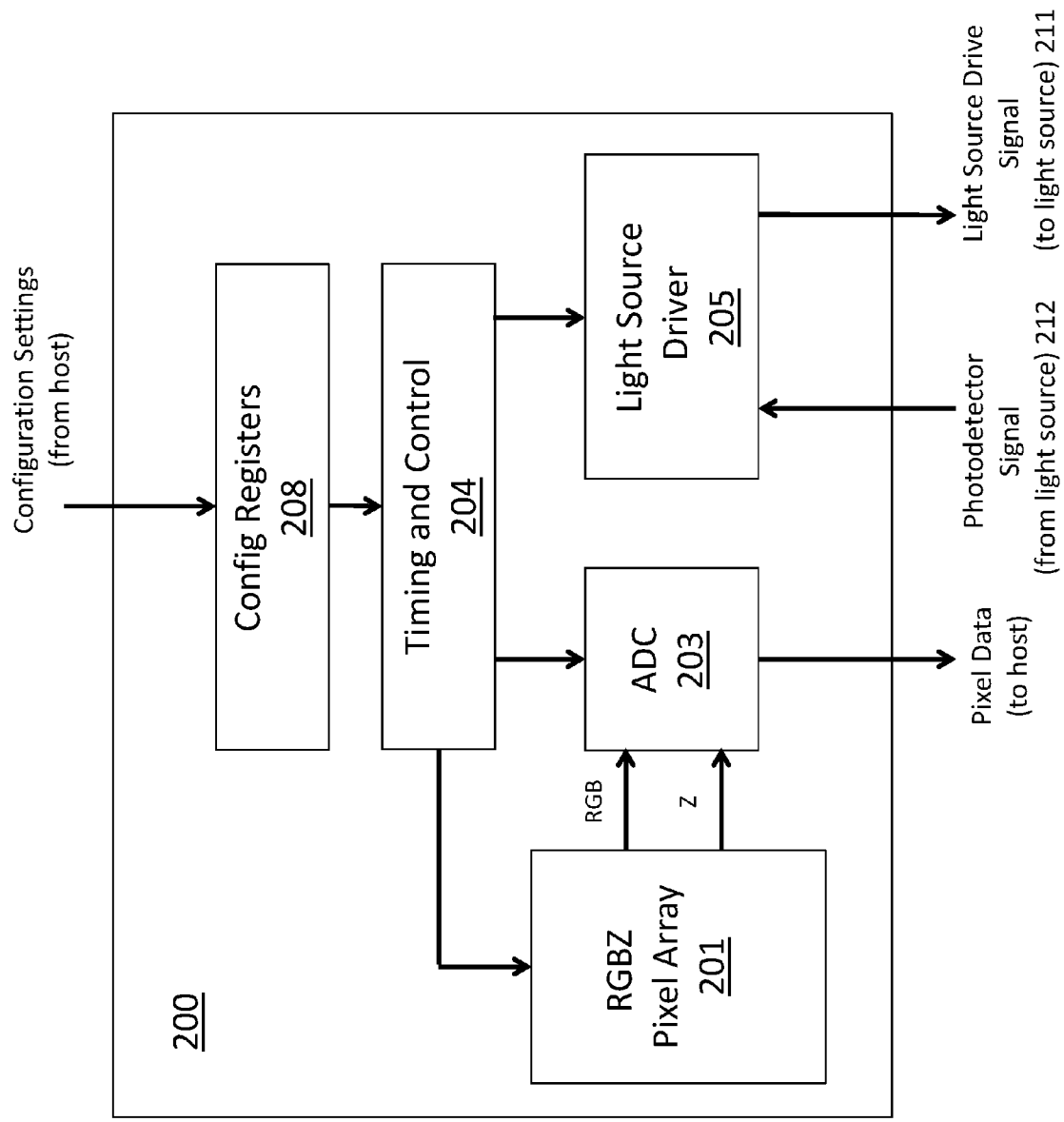
FIG. 2 shows a system diagram of an integrated image sensor and light source driver.

FIG. 2 shows a depiction of the system architecture 200 for integrated image sensor and light source driver 100 of FIGS. 1a and 1b. As observed in FIG. 2, the light source driver circuitry 205 provides a drive signal 211 to the illuminator (not shown). The amplitude of the drive signal determines the optical power of the light emitted from the illuminator. In an embodiment, the illuminator includes a photo-detector that generates a higher amplitude signal as the optical intensity emitted by the illuminator increases. According to the system architecture 200 of FIG. 2, the photo-detector signal 212 is received by the light source driver circuitry and incorporated into a controlled feedback loop to control the amplitude of the drive signal 211.

The drive signal 211 may also be modulated, e.g., in the form of a sinusoidal or clock signal, to implement continuous wave illumination. Timing and control circuitry 204 provides the modulation signal to the light source driver circuitry 205. In the case where the modulation signal is akin to a clock signal, one logic value of the clock signal corresponds to the illuminator being "on" while the other logic value corresponds to the illuminator being "off". As such, the illuminator flashes light in an on-off-on-off fashion into the camera's field of view. In various embodiments, the light source(s) of the illuminator may be arranged as an array of vertical cavity side emitting laser diodes (VCSELs) or light emitting diodes (LEDs) each coupled to a same anode terminal and a same cathode terminal (so that all VCSEL/LEDs of the array turn on and off together), and where, the drive signal 211 from the light source driver 205 is coupled to one of the anode or cathode of the array.

The "Z" pixels of the RGBZ pixel array 201 effectively perform "3D" time-of-flight depth measurements by generating charge as a function of the time between when the illuminator's light was flashed "on" and when the flash's reflected light is received at the sensor. The Z pixels receive clock signals from timing and control circuitry 204 that each have a known phase relationship with the illuminator's clock signal. In one embodiment, there are four such clock signals (e.g., 0°, 90°, 180° and 270° quadrature arms) provided to each region of the pixel array 201 where a depth value is to be measured.

Here, Z pixels that are clocked by clocks of differing phase will collect different amounts of charge for a same light flash. Collected charge signals from differently clocked Z pixels in a same/proximate region of the sensor can be combined to generate a specific time-of-flight value for the sensor region. In a typical implementation, such combination is made by the host system (e.g., processor or applications processor) with an image signal processor. As such, the ADC circuitry 203 typically converts analog signals representing the charge collected by the individual Z pixels into digital values that are forwarded to the host system which subsequently calculates the depth information from the digitized pixel values. In other embodiments, various forms of image signal processing, including but not limited to the calculation of the depth information from the pixels may be performed by logic circuitry external to the host side (e.g., logic circuitry disposed on a same semiconductor chip that includes the image sensor or some other semiconductor chip included in the camera peripheral).

The RGB pixels of the RGBZ pixel array 201 are used for "2D" traditional image capture and are respectively sensitive to red, green and blue visible light within the camera's field of view. The ADC circuitry 203 likewise receives analog signals from the RGB pixels of the pixel array 201 and converts them to digital values that are forwarded to the host system. Although a common approach includes RGB pixels for the visible image capture, other embodiments may use different colored pixel schemes (e.g., Cyan, Magenta and Yellow).

The timing and control circuit 204 generates respective clock signals that are sent to the light source driver 205, the pixel array 201 and the ADC circuitry 203. Other signals, such as control signals generated in response to commands or configuration information that is received from the host system and stored in configuration registers 208 may also be generated from the timing and control circuitry. For ease of drawing purposes, FIGS. 1a and 1b do not depict the configuration registers 208 of FIG. 2.

Notably, because traditional image sensors do not have an integrated illuminator driver, traditional image sensor timing and control circuits only generate control and clocking signals for image sensor components (notably, the ADC circuitry 203 and the pixel array 201). By contrast, the timing and control circuit 204 in various embodiments may be considered unique because, apart from providing clock and control signals used for image reception, it also generates timing and control circuitry for a light source drive circuit 205. Note that, architecturally speaking, image sensor timing and control circuitry that also generates timing and/or control signals for a light source drive circuit is believed to be unique whether or not the light source drive circuit is integrated on the same semiconductor chip with the image sensor timing and control circuitry.

Figure 3A:
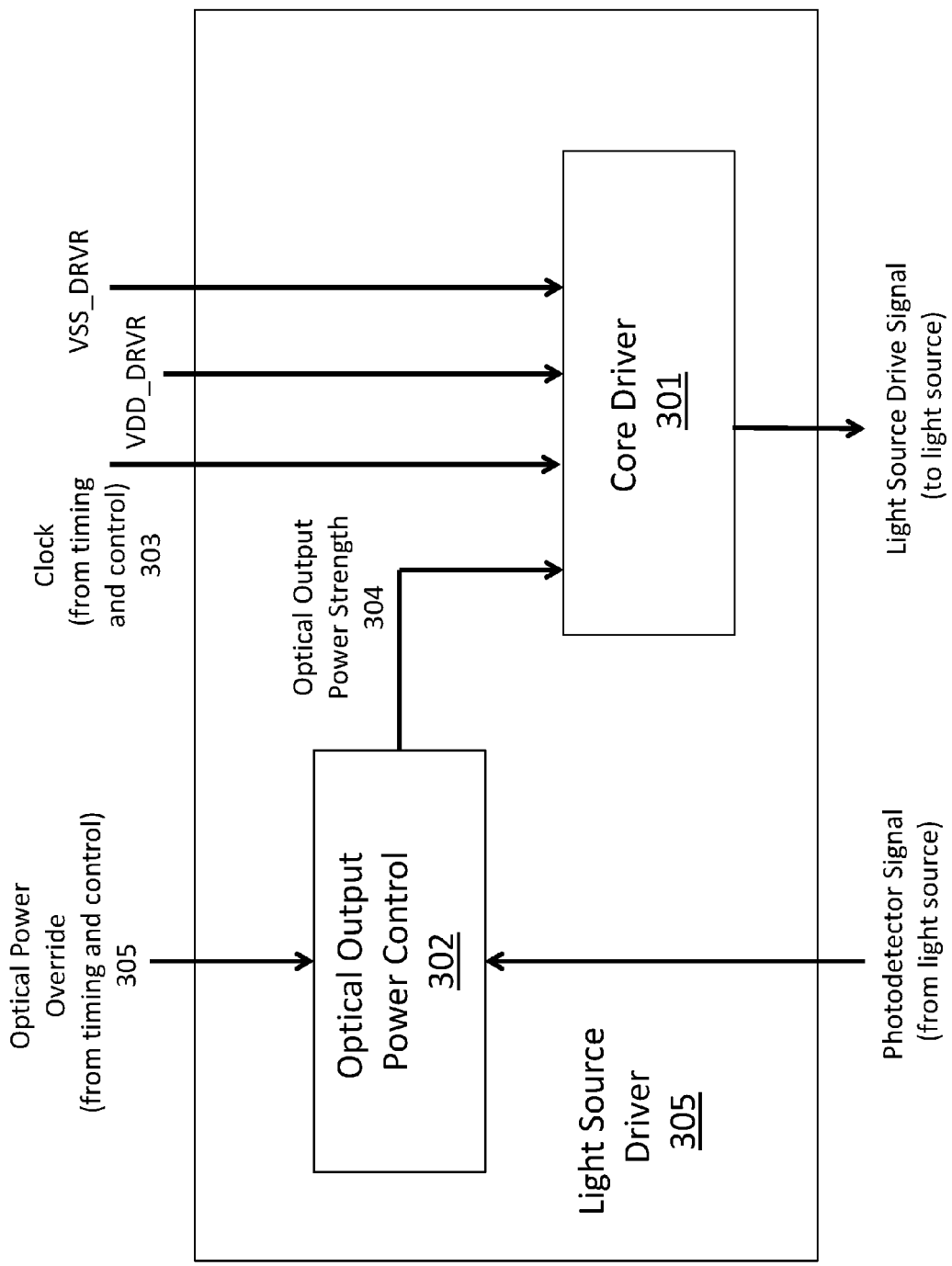
FIG. 3a shows a system diagram of a light source driver.
Figure 3B:
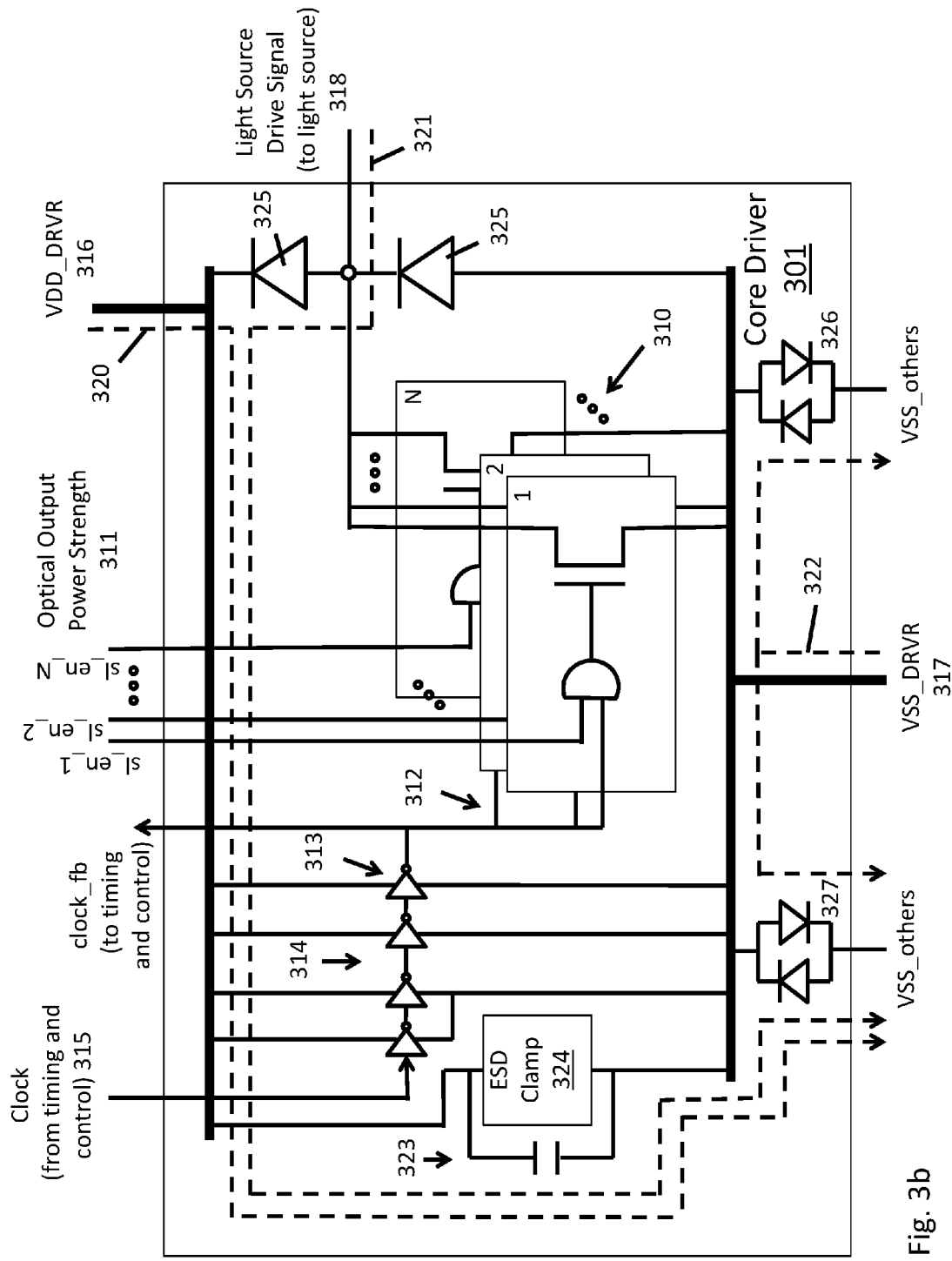
FIG. 3b shows a diagram of a core light source driver.
Figure 3C:
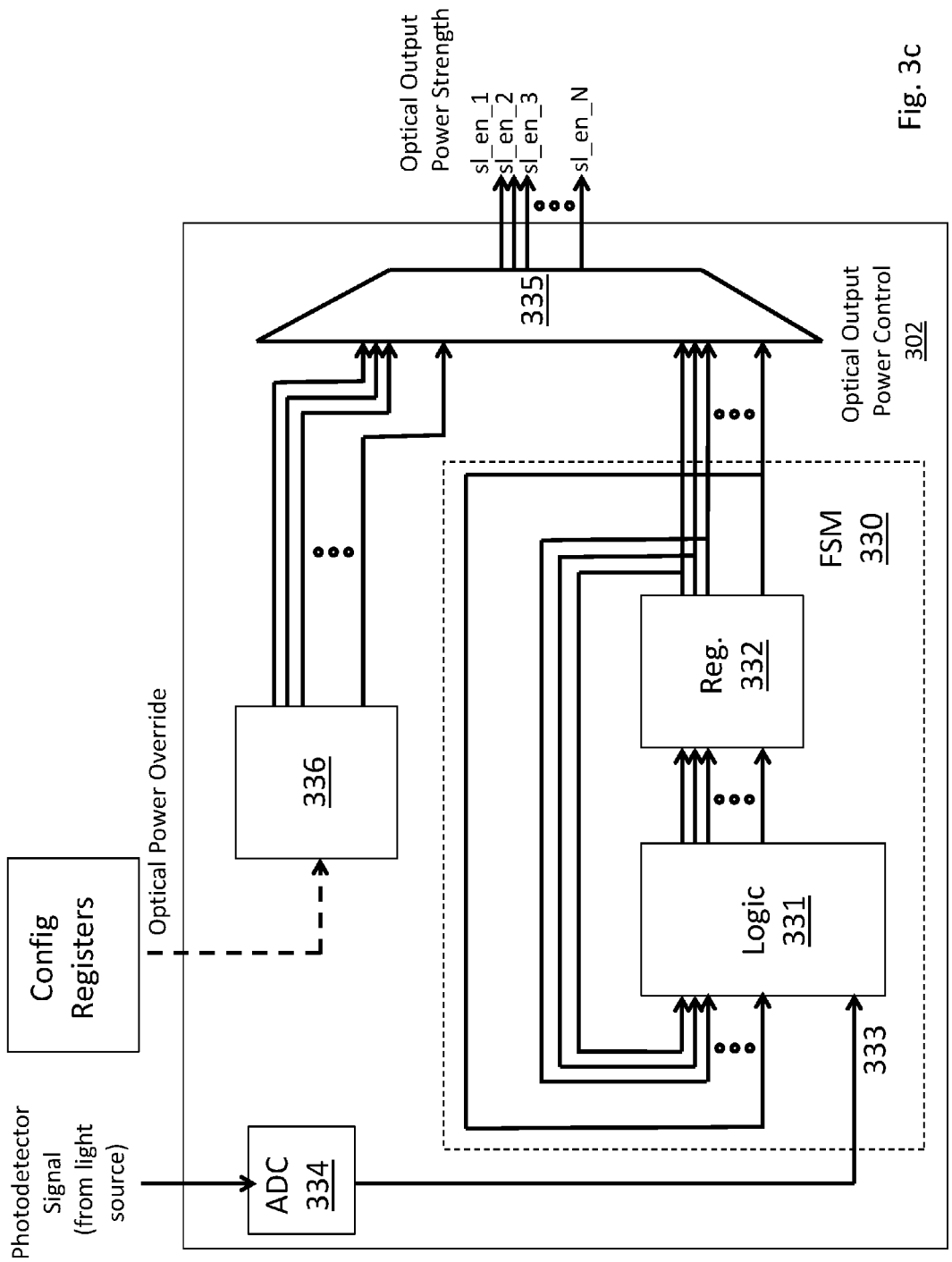
FIG. 3c shows a diagram of a optical output power circuit.

FIGS. 3a through 3c show aspects of the laser driver circuit 205 of FIG. 2. As observed in FIG. 3a, the laser driver circuit 305 can be viewed as including a core driver circuit 301 and a power control circuit 302. The core driver circuit 301 provides the drive current that is driven through the light source. The core driver circuit 301 also receives a waveform (e.g., clock signal, sinusoid, etc.) as a modulation signal 303 for the drive signal. As discussed above, the modulation signal determines the timing of the manner in which the light source is flashed.

The optical output power control circuit 302 provides to the core driver circuit 301 a signal 304 that specifies the magnitude of the drive signal. The magnitude of the drive signal, in turn, determines the optical power emitted by the light source. In an embodiment, the power control circuit 302 also receives the photodiode current (or an indication of the RMS or average value thereof) from the light source array. As discussed in more detail below, the photodiode current provides an indication of the optical output power presently being emitted by the light source, and, the optical output power control circuit 302 uses the photodetector current as an input into to a controlled feedback loop. The optical output power control circuit 302 may also receive an override optical power value that overrides the aforementioned feedback loop for, e.g., testing or manufacturing environments. Each of these features will be described more thoroughly immediately below.

FIG. 3b shows an embodiment of the core driver circuit 301. As observed in FIG. 3a, the core driver 301 includes a plurality of driver "slices" 310 each having a drive transistor and an enable gate. In order to establish a specific drive strength for the core driver 301, the core driver 301 is configured to receive input information 311 that defines the number of the slices to activate. According to the specific embodiment of FIG. 3, the input information takes the form of a bus with each wire of the bus corresponding to an active/inactive signal for a particular slice.

Each of the driver slices also include a clock signal input 312 to receive a digital clock signal. The clock signal modulates the current being pulled by the drive transistors of the enabled slices such that the light source flashes in an on-off-on-off sequence as discussed above. Because the set of driver slices present a large input capacitance at the clock signal input, an inverting drive buffer 313 having sufficient output current drive strength to drive the clock signal input capacitance is coupled to the clock signal input 312. As observed in FIG. 3b, the inverting drive buffer 313 and preceding buffer/inverters 314 form a fan-up chain to increase the drive strength of the drive buffer 313. A fan-up chain includes a series of buffers/inverters where each buffer/inverter in the chain provides greater output drive strength that its preceding buffer/inverter. Thus, per buffer/inverter output drive strength is essentially amplified moving forward in the chain. In the embodiment of FIG. 3b, four inverters produce sufficient drive strength at the output of inverting drive buffer 313.

The core driver circuit 301 includes special, isolated upper and lower power rails VDD_DRVR 316 and VSS_DRVR 317. In an embodiment, each of these power rails 316, 317 is supplied by a respective external, off-die voltage regulator (not shown) that is dedicated to the core driver circuit. Multiple I/Os (balls/pads) of the core driver's semiconductor chip are reserved for each of the rails to ensure low resistance between the regulators and the integrated sensor/driver package.

In an embodiment where the semiconductor die is wire bonded to the package substrate, multiple pads of the IC are reserved for both rails, and each of the multiple pads is double bonded to the package substrate (again, to reduce resistance between the package substrate and the semiconductor chip). Here, as the core driver circuit may drive significant amounts of current, keeping resistance low along the supply rails keep power dissipation low through the IC wire bonds.

The core driver circuit 301 also includes other circuitry to provide for electro-static discharge (ESD) protection and isolation from the other circuits on the semiconductor chip. With respect to ESD protection, it is pertinent to recognize that any node of the core driver circuit 301 that is connected to a package I/O may receive a large amount of ESD charge. These nodes include any of the VDD_DRVR 316, VSS_DRVR 317 and the light source drive signal output node 318. In order to protect the core driver circuit 301, the core driver circuit 301 should include a current pathway out of the circuit 301 from any of these nodes 316, 317, 318 should they receive electro-static discharge.

FIG. 3b shows a first current path 320 out of the circuit 310 if the VDD_DRVR node 316 is charged, a second current path 321 out of the circuit 310 if the drive signal output 318 is charged and third current path(s) 322 out of the circuit if the VSS_DRVR node 317 is charged. These paths 320, 321, 322 flow into "other" VSS nodes of the semiconductor die (e.g., VSS nodes used by circuits of the semiconductor die other than the core driver 301).

Note that some of these paths 320, 322 flow through a bypass capacitor 323 that resides between the VDD_DRVR and VSS_DRVR nodes. The bypass capacitor 323 and an ESD clamp circuit 324 also help prevent the generation of a large, damaging voltage difference across the VDD_DRVR 316 and VSS_DRVR 317 nodes as a consequence of being charged. Likewise, a large voltage is prevented from being generated at the light source drive output by protective clamping diodes 325.

The core driver circuit 301, in driving the light source, may be asked to drive large amounts of current and therefore may have the propensity to act as a noise source for other circuits on the semiconductor die or otherwise within the package. As such, the core driver circuit 301 also includes a number of isolation features.

A first isolation feature is the separate VDD_DRVR and VSS_DRVR supply rails 316, 317 discussed above that are driven by their own voltage regulators (i.e., in an embodiment the voltage regulators do not drive other circuits besides the VDD_DRVR and VSS_DRVR rails respective rails). A second isolation feature is the presence of isolation clamps 326, 327 that reside at both points of contact between the core driver circuit and the other VSS nodes. Here, the ESD protection paths out of the core driver circuit effectively couple the VSS_DRVR node to the other VSS nodes. Such coupling can permit noise generated by the core driver circuit 301 to reach other circuits within the semiconductor die. The isolation clamps 326, 327 help squelch such noise coupling.

A fourth isolation feature is to implement the transistors of the core driver in a "deep well" technology such as a deep N well technology. A deep well technology embeds active devices in a well of a first dopant polarity (e.g., P). Deeper within the substrate the first well is embedded within a larger well of opposite polarity (e.g., N) which is itself embedded within a substrate of first dopant polarity (e.g., P). The junctions of opposite polarity effectively create noise barriers between the active devices and the substrate. In some embodiments active devices may also reside within the larger well.

A fifth isolation feature recognizes that the high currents generated by the core drive circuit may generate hot carriers that induce photon generation. The generation of photons, in turn, may interfere with the operation of the sensor array. As such, in one embodiment, one of the metallization layers of the integrated circuit is used to form a wide/large surface area of solid conductive material (e.g., metal) above the core driver circuit. The large conductive region above the core driver acts as a shield that should substantially prevent any photons generated by the core driver 301 from reaching other circuits such as the pixel array.

FIG. 3c shows an embodiment of the power control circuit 302. As observed in FIG. 3c, the power control circuit 302 includes a finite state machine 330. As is known in the art a finite state machine 330 typically includes combinatorial logic 331 in front of a register 332 where the register state feeds back to the combinatorial logic 331 and where the combinatorial logic 331 also receives another independent input 333. In an embodiment, the combinatorial logic 331 is implemented with a look-up table (e.g., implemented with, e.g., content addressable register or memory cells). In other embodiments the combinatorial logic 331 may be implemented with hardwired logic circuits or a combination of a look-up table and hardwired logic implementations.

The register state corresponds to the output of the power control circuit 302 and defines which core driver slices are to be enabled. The independent input 333 provided to the combinatorial logic 331 of the finite state machine corresponds to a photodetector current. Here, the light source array is assumed to include a photodiode that provides an output signal that is proportional to the actual intensity of the light that the light source array is emitting (or, given that the optical signal is in the form of a periodic signal, the average or the root-mean-square (RMS) of the photocurrent may be utilized). The photodetector signal is converted to digital form by an ADC circuit 334 and provided to the combinatorial logic 331. The combinatorial logic 331 determines a number of core driver slices to enable as a function of the current number of core driver slices that are enabled and the current photodector current.

In alternate implementations the finite state machine may be replaced with a more traditional controlled feedback loop having a loop filter that generates a signal whose value indicates the number of slices to enable by integrating an offset signal generated from, e.g., a desired optical power signal and an actual optical power signal derived from the photodetector signal. The traditional feedback loop may be implemented with digital and/or analog circuits.

Notably, the power control circuit also includes an over-ride multiplexer 335 to effectively over-ride the determined number of slices from the finite state machine and, instead, provide a more customized indication of the number of slices to enable. The over-ride can be used, e.g., to set a stronger optical output signal than is typical to simulate the illuminator being closer to an object of interest than it actually is, or, set a weaker optical output signal than is typical to simulate the presence of the illuminator being farther away from an object of interest than it actually is.

The customized number of slices may be provided directly from configuration register space, or, may be provided from a look up table (LUT), hardwired logic or other circuitry 335 that determines the correct number of core driver slices to enable in response to a user provided value for any of the following in configuration register space: 1) optical output power; 2) simulated additional distance away; 3) simulated additional distance closer. The configuration register space may also include an "override enable" parameter that is used to set the channel select input of the override multiplexer 335 (such that the user provided value is used if the override is enabled).

FIG. 4 shows clocking circuitry for the laser driver circuit and pixel array. The clocking circuitry of FIG. 4 may also provide clock signals to the ADC circuitry. As observed in FIG. 4 the clocking circuitry can be viewed as a component of the timing and control circuitry 104, 204 of FIGS. 1a,b and 2.

As observed in FIG. 4 the clocking circuitry includes a phase locked loop (PLL) circuit 410 that acts as a clock source. The clock signal output of the PLL is coupled to an IQ block 411 that generates four different phases of the PLL clock signal (0°, 90°, 180° and)270°. All four phased clock signals are routed to the pixel array and a phase interpolator 414. The phase interpolator 414 provides the clock signal 415 that is directed to the core drive circuit as a modulation signal. The phase interpolator 414 is part of a delay locked loop (DLL) that varies the phase positioning of the clock signal 415 in order to eliminate timing skew (phase mismatch) between the clock signals 416 that are directed to the pixel array and the clock signal 415 that is directed to the core driver.

Here, as discussed above, time-of-flight techniques measure the difference in time between when light is flashed by the illuminator and when its reflection is sensed at the pixel array. Any unaccounted for difference between these times is reproduced as error or inaccuracy in the time-of-flight measurement and the profile distance information that is determined from it. As such, controlling skew between the clock signal 312, 412 that is presented to the driving transistors within the core driver and the clocks 416 that are provided to the pixel array have a direct effect on the accuracy of the time-of-flight measurement.

As such, the DLL includes a phase detector 417 that compares the phase difference between the clock signal that is provided to the driving transistors 312, 412 of the core driver circuit slices and the 0° phase clock signal 416_1 that is directed to the pixel array. In response to any difference in phase between the two, the phase detector 417 generates an offset signal that indicates a corrective direction by the phase interpolator 414 that will reduce the offset. In an alternative implementation, rather than use the output from buffer 313 as an input to phase detector 417, an output is taken further downstream from buffer 313 such as core driver output 318. Because core driver output 318 may include some additional propagation delay that is imposed in the drive signal beyond buffer 313, tapping the drive signal at core driver output 318 is actually a more accurate signal in terms of the timing edges of the emitted optical signal. In an even further implementation, a "dummy slice" may be coupled anywhere downstream from core input 315 to "mimic" the light source drive signal or emitted optical output signal. For example, the core driver 301 may include a "duplicate" set of fan-up, inverting buffer, driver slice(s) and "dummy load" circuitry (the later to represent the load of the VCSEL or LED light sources) to craft a signal that should be nearly identical to the signal received by the light sources or the actual emitted optical power.

The offset signal from the phase detector 417 is provided to a loop filter 418. The loop filter 418 integrates the offset signal to generate a control signal to the phase interpolator 414 that adjusts the phase of the clock signal 415 that is provided to the core driver circuit that corrects for the previously detected offset. Ideally, a steady state is reached in which there is no phase difference between the signal that is provided to the driver transistors and the 0° phase signal 416_1 that is sent to the pixel array. Any other time difference between the actual emission of the light from the light source and the phase of the signal that is provided to the drive transistors is apt to be fixed and/or an otherwise determinable from, e.g., one or more propagation delays and light source response times that can be adjusted for as a fixed offset.

The DLL path to the phase interpolator 414 is also intercepted by an override multiplexer 419 that allows a user to set, e.g., in configuration register space 408, an adjustment to the output of the loop filter 418. For example, if the output of the loop filter 418 is a voltage level that the phase interpolator 414 uses to set the phase of clock signal 415, circuit 420 may increase or decrease this voltage level in increments according to a programmed value from configuration register space 408. Here, the ability to adjust the loop filter output voltage up or down essentially permits the user to impose phase lag or phase lead to clock signal 415 relative to the actual loop filter setting, which, in turn, corresponds to the deliberate imposition of "offset" into the time-of-flight measurement. In various implementations the phase interpolator 414 may receive a digital word as its control signal rather than an analog signal. As such, the loop filter 418 may be implemented as a digital circuit (e.g., a digital accumulator or finite state machine). Likewise circuit 420 may be implemented as a digital circuit (e.g., a digital adder/subtractor) to digitally alter the loop filter output.

Similar to the optical power override discussed above with respect to FIG. 3c, the deliberate imposition of offset into the phase of clock signal 415 can be used to simulate the camera system being closer to or farther from an object of interest. More specifically, both the optical power over ride and the DLL over ride can be used together to simulate the camera being some distance from an object other than its actual distance. That is, by lessening the optical power and imposing additional delay to clock signal 415, the Z pixels of the RGBZ sensor will receive signals of reduced intensity and later in time as if the camera where farther away from an object than it actually is. By contrast, by increasing the optical power and moving the delay of clock signal 415 earlier in time, the Z pixels of the RGBZ sensor will receive signals of enhanced intensity earlier in time as if the camera where closer to an object than it actually is.

Here, it is pertinent to recognize some alternative embodiments to imposing a simulated distance between the light source and an object that is different than an actual distance between the light source and the object. Embodiments discussed so far include adjusting the amplitude and phase of the light source drive signal. Conceivably, a stronger optical signal from a closer object can be simulated by increasing the gain of the depth pixels to capture more charge and therefore generate a higher amplitude signal from the depth pixels. Likewise, a weaker optical signal from an object that is farther away can be simulated by decreasing the gain of the depth pixels to capture less charge and therefore generate a lower amplitude signal from the depth pixels.

Any combination of these techniques may be used to realize the desired simulated distance. As such, various embodiments may include a depth pixel gain adjustment circuit responsive to simulated distance configuration settings to accordingly adjust the gain of the depth pixels.

Additionally a phase interpolator circuit may be used to drive the depth pixel clock signals (e.g., instead of the light source drive signal) to impose phase adjustments to the depth pixel clock signals to realize the simulated distance. As such, more generally, the relative phases of the light source driver signal and the depth pixel clocks may be adjusted to be closer together in time to simulate an object that is closer, and, the relative phases of the light source driver signal and the depth pixel clocks may be adjusted to be farther apart in time to simulate an object that is farther away.

The programmable register space 408 for changing the delay of clock signal 415 may accept any of: 1) a value that specifies a specific change to be made to the loop filter output; 2) simulated additional distance away; 3) simulated additional distance closer. Items 2) and 3) above may be the same configuration space that is used to set the optical power override. In the case of items 2) and 3) above, circuit 420 includes circuitry to determine the correct adjustment to be made to the loop filter output based on the desired simulated distance. In an embodiment, items 2) and 3) can specify the simulated distances in specific increments and circuit 420 adjusts the loop filter output in increments.

In an embodiment, the loop filter 418 is implemented as an analog or mixed signal component that provides the phase interpolator control signal as an analog signal (e.g., a voltage). In another embodiment, the loop filter 418 is implemented as a finite state machine that controls the interpolator with a digital value. In the former case, circuit 420 adjusts the level of the analog signal, in the later case circuit 420 adds/subtracts to/from the digital value. Configuration registers 408 may also include register space that determines whether the DLL circuit is to operate with or without adjustments from circuit 420. As observed in FIG. 4, the multiplexer 419 may include an input to receive a phase interpolator control input directly from configuration register space 408 without any component from the loop filter and circuit 420. The channel select input of multiplexer 419 is established in response. In a further embodiment, parameters of the loop filter 418 itself (e.g., time constant, pole frequency, finite state machine combinatorial logic look-up table values, etc.) can be configured from registers 408.

The timing and control circuitry of FIG. 4 may also generate other timing and control signals such as timing and control signals for the ADC circuits that digitize analog signals from the RGB visible image capture pixels of the pixel array as well as RGB visible image capture pixels themselves. For simplicity the circuitry used to generate these timing and control signals are not shown in FIG. 4.

Figure 5A:
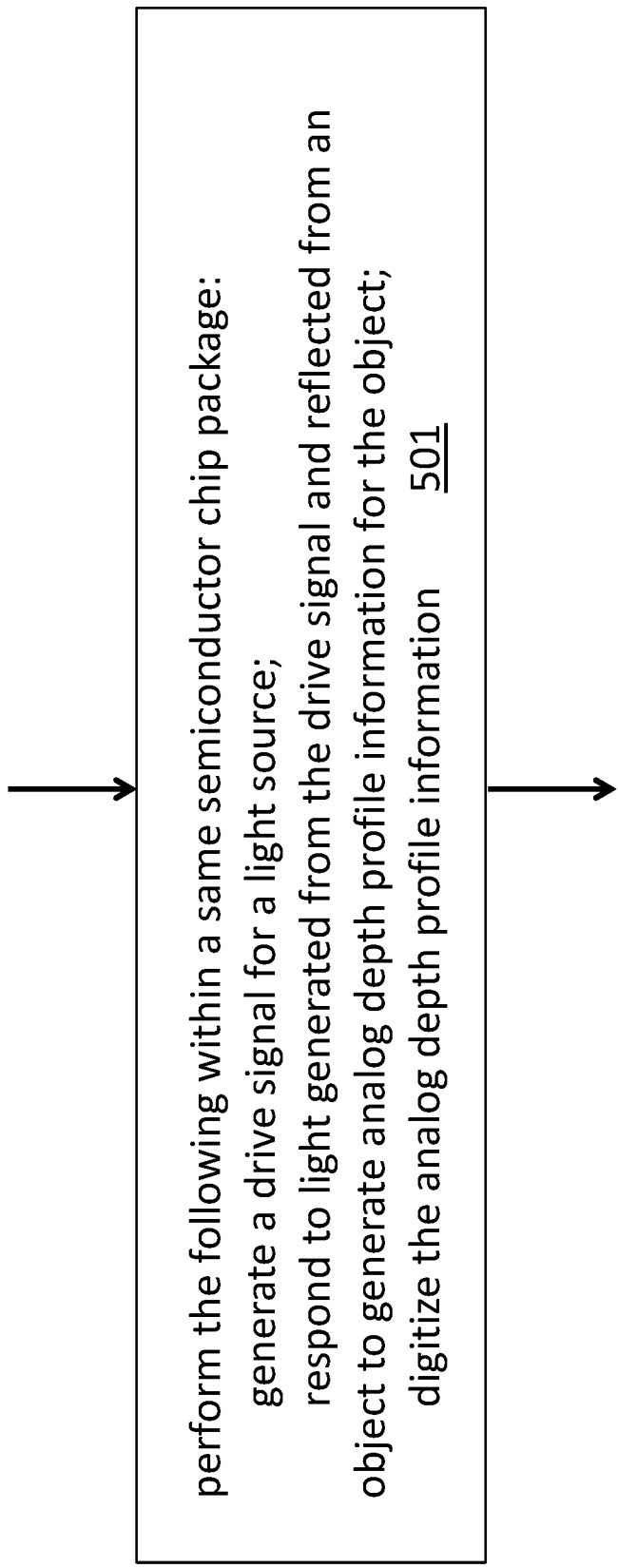
FIG. 5a shows a first methodology performed by an integrated image sensor and light source driver.

FIG. 5a shows a first methodology that can be performed by embodiments of the integrated image sensor and light source driver described above. As observed in FIG. 5a, the first methodology includes performing the following within a same semiconductor chip package: generating a drive signal for a light source; responding to light generated from the drive signal and reflected from an object to generate analog depth profile information for the object; and, digitizing the analog depth profile information.

Figure 5B:
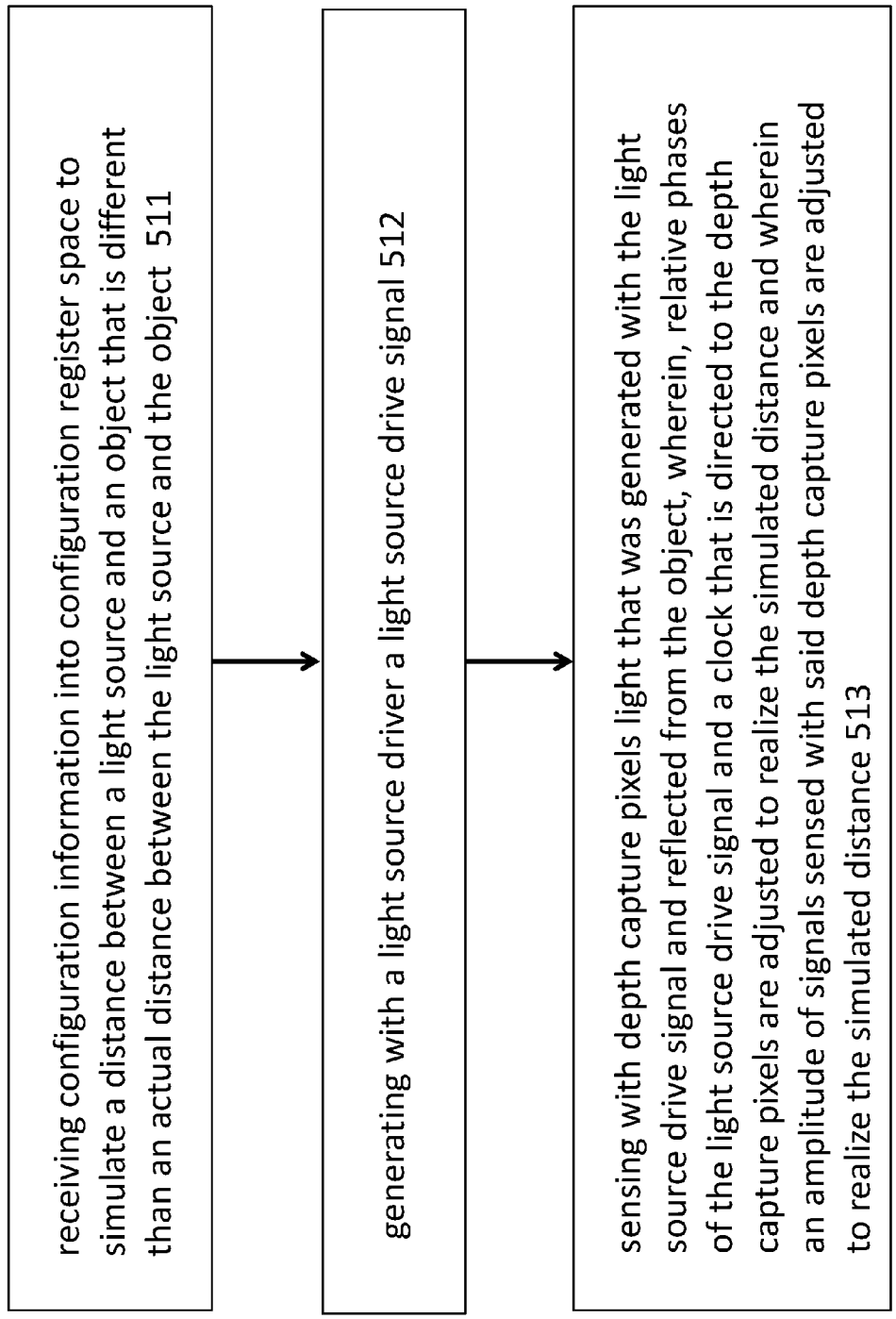
FIG. 5b shows a second methodology performed by an integrated image sensor and light source driver.

FIG. 5b shows a second methodology that can be performed by embodiments of the integrated image sensor and light source driver described above. As observed in FIG. 5b the second methodology includes receiving into configuration register space configuration information to simulate a distance between a light source and an object that is different than an actual distance between the light source and the object 511. The method also includes generating with a light source driver a light source drive signal 512. The method also includes sensing with depth capture pixels light that was generated with the light source drive signal and reflected from an object, wherein, relative phases of the light source drive signal and a clock that is directed to the depth capture pixels are adjusted to realize the simulated distance and wherein an amplitude of signals sensed with said depth capture pixels are adjusted to realize the simulated distance 513.

Figure 6A:
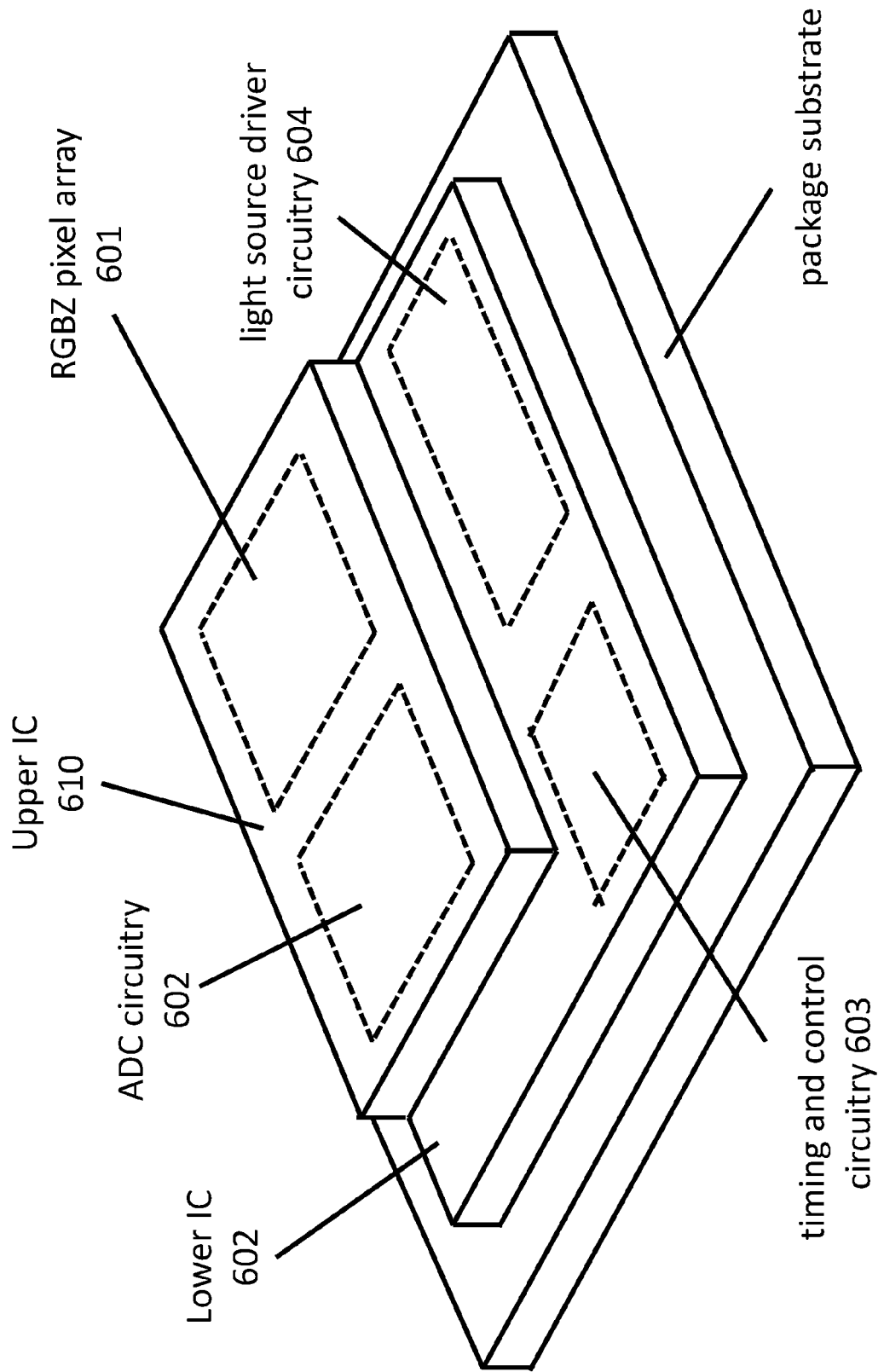
FIG. 6a shows another embodiment of an integrated image sensor and light source driver.
Figure 6B:
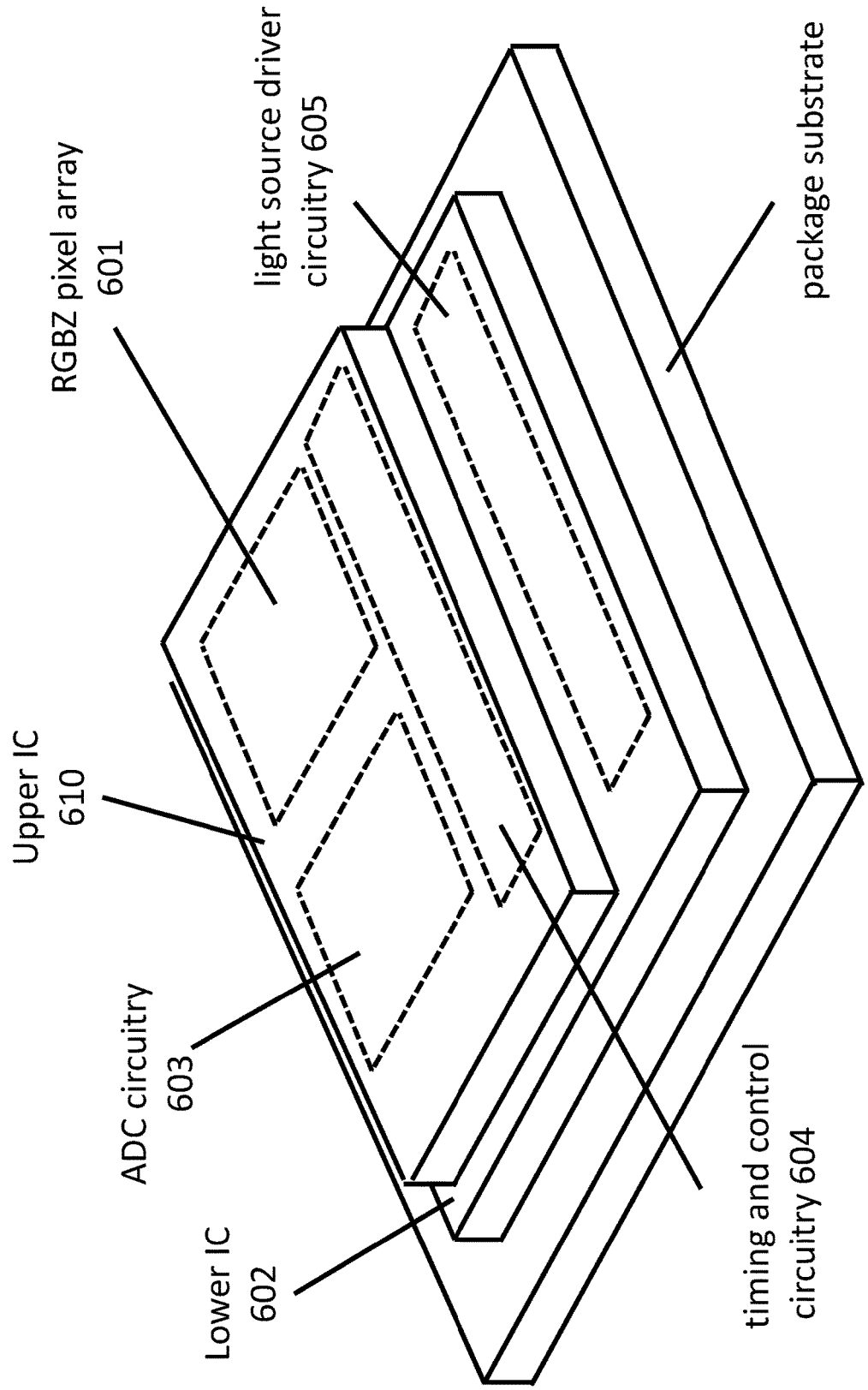
FIG. 6b shows yet another embodiment of an integrated image sensor and light source driver.

FIGS. 6a and 6b show alternate embodiments of an integrated image sensor and light source driver. As observed in FIG. 6a, the ADC circuitry 603 is on the same upper semiconductor die 610 as the pixel array 601 instead of being on the lower semiconductor die 602 having the light source driver circuit 605. As observed in FIG. 6b, the upper semiconductor die 610 is a complete image sensor having the pixel array 601, ADC circuitry 603 and timing and control circuitry 604. The lower semiconductor die 610 has the light source driver circuitry 605. Still other embodiments may have different portions of any of the ADC circuitry, timing and control circuitry and light source driver on both the upper and the lower semiconductor die.

Figure 7:
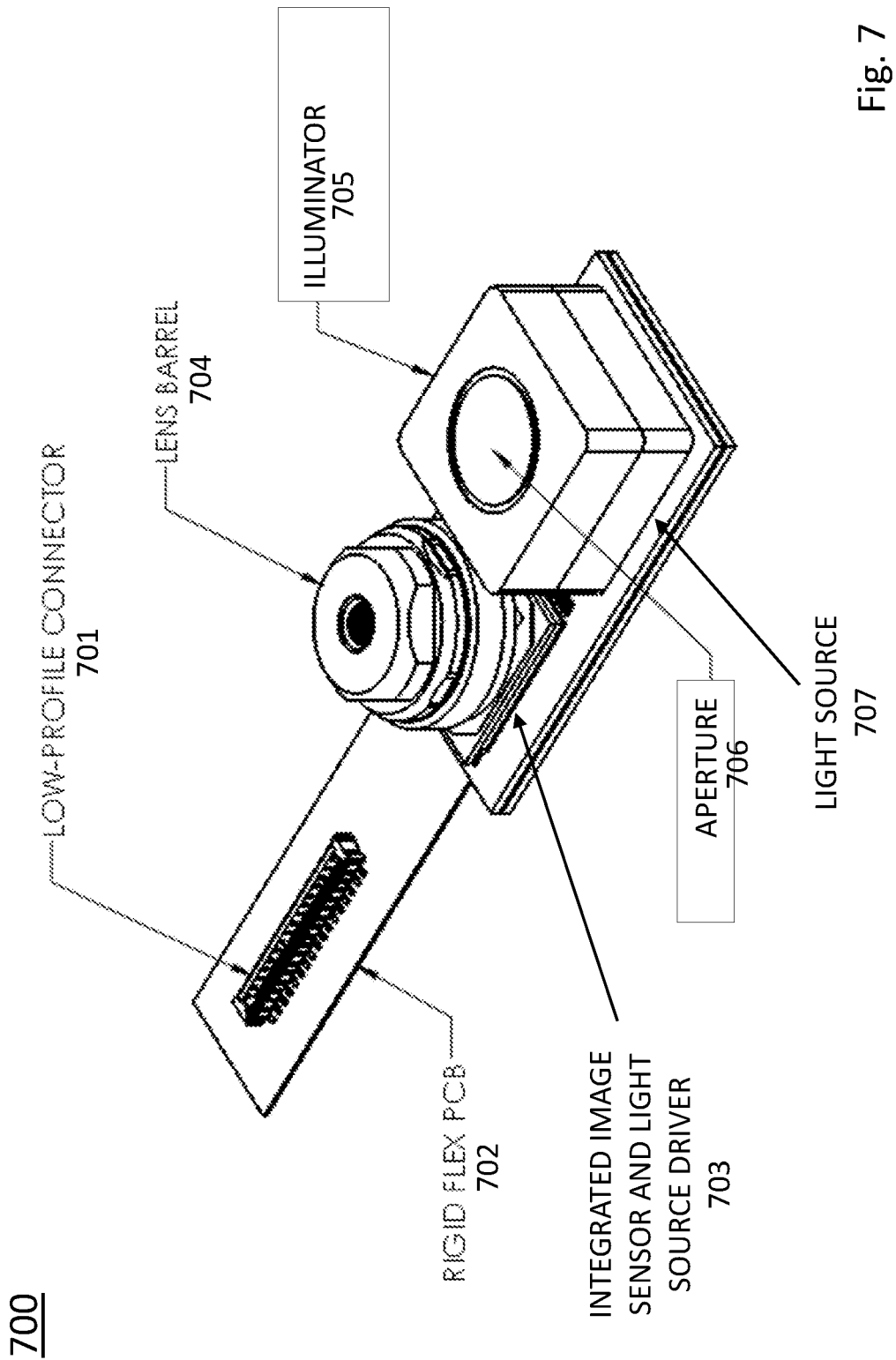
FIG. 7 shows an embodiment of a 2D/3D camera system having an integrated image sensor and light source driver.

FIG. 7 shows an integrated traditional camera and time-of-flight imaging system 700. The system 700 has a connector 701 for making electrical contact, e.g., with a larger system/mother board, such as the system/mother board of a laptop computer, tablet computer or smartphone. Depending on layout and implementation, the connector 701 may connect to a flex cable that, e.g., makes actual connection to the system/mother board, or, the connector 701 may make contact to the system/mother board directly.

The connector 701 is affixed to a planar board 702 that may be implemented as a multi-layered structure of alternating conductive and insulating layers where the conductive layers are patterned to form electronic traces that support the internal electrical connections of the system 700. Through the connector 701 commands are received from the larger host system such as configuration commands that write/read configuration information to/from configuration registers within the camera system 700.

An RGBZ image sensor and light source driver 703 are integrated into a same semiconductor die package that is mounted to the planar board 702 beneath a receiving lens 702. The RGBZ image sensor includes a pixel array having different kinds of pixels, some of which are sensitive to visible light (specifically, a subset of R pixels that are sensitive to visible red light, a subset of G pixels that are sensitive to visible green light and a subset of B pixels that are sensitive to blue light) and others of which are sensitive to IR light. The RGB pixels are used to support traditional "2D" visible image capture (traditional picture taking) functions. The IR sensitive pixels are used to support 3D depth profile imaging using time-of-flight techniques. Although a basic embodiment includes RGB pixels for the visible image capture, other embodiments may use different colored pixel schemes (e.g., Cyan, Magenta and Yellow). The integrated image sensor and light source driver 703 may also include ADC circuitry for digitizing the signals from the image sensor and timing and control circuitry for generating clocking and control signals for the pixel array, the ADC circuitry and the light source driver circuit.

The planar board 702 may likewise include signal traces to carry digital information provided by the ADC circuitry to the connector 701 for processing by a higher end component of the host computing system, such as an image signal processing pipeline (e.g., that is integrated on an applications processor).

A camera lens module 704 is integrated above the integrated RGBZ image sensor and light source driver 703. The camera lens module 704 contains a system of one or more lenses to focus received light through an aperture of the integrated image sensor and light source driver 703. As the camera lens module's reception of visible light may interfere with the reception of IR light by the image sensor's time-of-flight pixels, and, contra-wise, as the camera module's reception of IR light may interfere with the reception of visible light by the image sensor's RGB pixels, either or both of the image sensor's pixel array and lens module 703 may contain a system of filters arranged to substantially block IR light that is to be received by RGB pixels, and, substantially block visible light that is to be received by time-of-flight pixels.

An illuminator 705 composed of a light source array 707 beneath an aperture 706 is also mounted on the planar board 701. The light source array 707 may be implemented on a semiconductor chip that is mounted to the planar board 701. The light source driver that is integrated in the same package 703 with the RGBZ image sensor is coupled to the light source array to cause it to emit light with a particular intensity and modulated waveform.

In an embodiment, the integrated system 700 of FIG. 7 support three modes of operation: 1) 2D mode; 3) 3D mode; and, 3) 2D/3D mode. In the case of 2D mode, the system behaves as a traditional camera. As such, illuminator 705 is disabled and the image sensor is used to receive visible images through its RGB pixels. In the case of 3D mode, the system is capturing time-of-flight depth information of an object in the field of view of the illuminator 705. As such, the illuminator 705 is enabled and emitting IR light (e.g., in an on-off-on-off . . . sequence) onto the object. The IR light is reflected from the object, received through the camera lens module 704 and sensed by the image sensor's time-of-flight pixels. In the case of 2D/3D mode, both the 2D and 3D modes described above are concurrently active.

Figure 8:
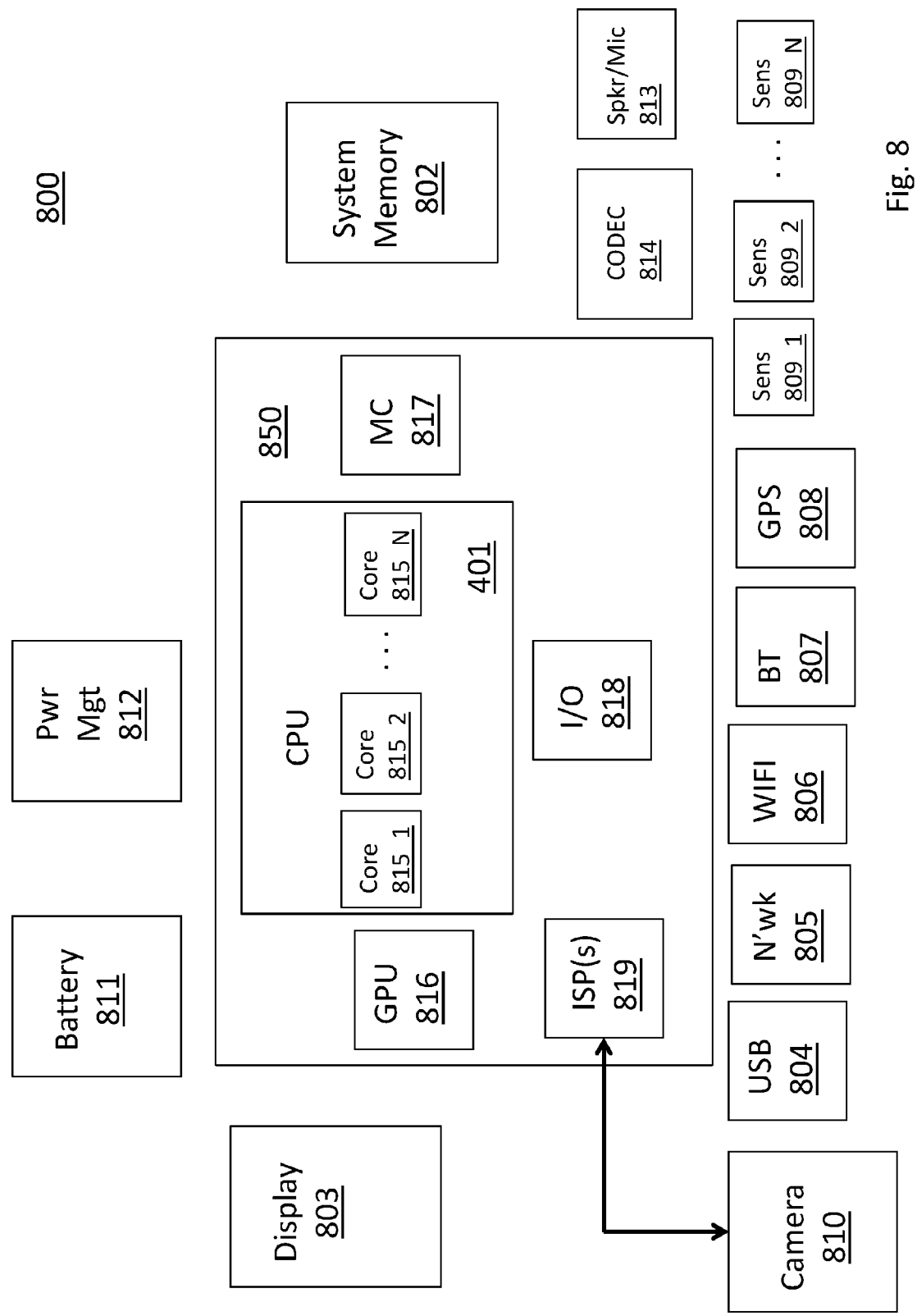
FIG. 8 shows an embodiment of a computing system having 2D/3D camera system having an integrated image sensor and light source driver.

FIG. 8 shows a depiction of an exemplary computing system 800 such as a personal computing system (e.g., desktop or laptop) or a mobile or handheld computing system such as a tablet device or smartphone. As observed in FIG. 8, the basic computing system may include a central processing unit 801 (which may include, e.g., a plurality of general purpose processing cores) and a main memory controller 817 disposed on an applications processor or multi-core processor 850, system memory 802, a display 803 (e.g., touchscreen, flat-panel), a local wired point-to-point link (e.g., USB) interface 804, various network I/O functions 805 (such as an Ethernet interface and/or cellular modem subsystem), a wireless local area network (e.g., WiFi) interface 806, a wireless point-to-point link (e.g., Bluetooth) interface 807 and a Global Positioning System interface 808, various sensors 809_1 through 809_N, one or more cameras 810, a battery 811, a power management control unit 812, a speaker and microphone 813 and an audio coder/decoder 814.

An applications processor or multi-core processor 850 may include one or more general purpose processing cores 815 within its CPU 401, one or more graphical processing units 816, a main memory controller 817, an I/O control function 818 and one or more image signal processor pipelines 819. The general purpose processing cores 815 typically execute the operating system and application software of the computing system. The graphics processing units 816 typically execute graphics intensive functions to, e.g., generate graphics information that is presented on the display 803. The memory control function 817 interfaces with the system memory 802. The image signal processing pipelines 819 receive image information from the camera and process the raw image information for downstream uses. The power management control unit 812 generally controls the power consumption of the system 800.

Each of the touchscreen display 803, the communication interfaces 804-807, the GPS interface 808, the sensors 809, the camera 810, and the speaker/microphone codec 813, 814 all can be viewed as various forms of I/O (input and/or output) relative to the overall computing system including, where appropriate, an integrated peripheral device as well (e.g., the one or more cameras 810). Depending on implementation, various ones of these I/O components may be integrated on the applications processor/multi-core processor 850 or may be located off the die or outside the package of the applications processor/multi-core processor 850.

In an embodiment one or more cameras 810 includes an integrated traditional visible image capture and time-of-flight depth measurement system having an RGBZ image sensor and light source driver integrated in a same semiconductor chip package. Application software, operating system software, device driver software and/or firmware executing on a general purpose CPU core (or other functional block having an instruction execution pipeline to execute program code) of an applications processor or other processor may direct commands to and receive image data from the camera system.

In the case of commands, the commands may include entrance into or exit from any of the 2D, 3D or 2D/3D system states discussed above. Additionally, commands may be directed to configuration space of the integrated image sensor and light source driver to implement any of the configured settings discussed above with respect to FIGS. 1*a*,*b* through 6*a*,*b*, including but not limited to a configuration that causes the integrated image sensor and light source driver to simulate the camera being closer to or farther from an object in its field of view that the camera actually is.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. A method, comprising:
receiving into configuration register space configuration information to simulate a distance between a light source and an object that is different than an actual distance between the light source and the object;
generating with a light source driver a light source drive signal; and,
sensing with depth capture pixels light that was generated with the light source drive signal and reflected from the object, wherein, relative phases of the light source drive signal and a clock that is directed to the depth capture pixels are adjusted to realize the simulated distance and wherein an amplitude of signals sensed with said depth capture pixels are adjusted to realize the simulated distance.

2. The method of claim 1 wherein the configuration register space, the light source driver and the depth capture pixels are integrated in a same semiconductor chip package.

3. The method of claim 2 wherein the depth capture pixels are integrated in a pixel array having visible light pixels, the pixel array integrated in the same semiconductor chip package.

4. The method of claim 3 further comprising capturing a visible image with said pixel array.

5. The method of claim 1 wherein the configuration information specifies that the light source is to be simulated as being closer to the object than it actually is.

6. The method of claim 5 wherein the adjustments to realize the simulated distance includes increasing the amplitude of the signals received with the depth capture pixels and moving the phase of the light source drive signal forward in time relative to the phase of the clock that is directed to the depth capture pixels.

7. The method of claim 1 wherein the configuration information specifies that the light source is to be simulated as being farther away from the object than it actually is.

8. The method of claim 7 wherein the adjustments to realize the simulated distance includes decreasing the amplitude of the signals received with the depth capture pixels and moving the phase of the light source drive signal backward in time relative to the phase of the clock that is directed to the depth capture pixels.

9. The method of claim 1 wherein the adjustments to realize the simulated distance includes changing a strength and a phase of said light source drive signal.

* * * * *